US008904115B2

(12) United States Patent
Chachad et al.

(10) Patent No.: US 8,904,115 B2
(45) Date of Patent: Dec. 2, 2014

(54) CACHE WITH MULTIPLE ACCESS PIPELINES

(75) Inventors: Abhijeet Ashok Chachad, Plano, TX (US); Raguram Damodaran, Plano, TX (US); Jonathan (Son) Hung Tran, Murphy, TX (US); Timothy David Anderson, Dallas, TX (US); Sanjive Agarwala, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 491 days.

(21) Appl. No.: 13/212,895

(22) Filed: Aug. 18, 2011

(65) Prior Publication Data

US 2012/0079204 A1 Mar. 29, 2012

Related U.S. Application Data

(60) Provisional application No. 61/387,283, filed on Sep. 28, 2010.

(51) Int. Cl.
| | |
|---|---|
| *G06F 12/00* | (2006.01) |
| *G06F 7/483* | (2006.01) |
| *G06F 12/02* | (2006.01) |
| *G06F 1/32* | (2006.01) |
| *G06F 9/30* | (2006.01) |
| *H03M 13/35* | (2006.01) |
| *H03M 13/29* | (2006.01) |
| *G06F 11/10* | (2006.01) |
| *H03K 19/00* | (2006.01) |
| *H03K 21/00* | (2006.01) |

(52) U.S. Cl.
CPC ............ *G06F 11/1064* (2013.01); *G06F 7/483* (2013.01); *G06F 12/0246* (2013.01); *G06F 1/3296* (2013.01); *G06F 9/3012* (2013.01); *H03M 13/353* (2013.01); *H03M 13/2903* (2013.01); *Y02B 60/32* (2013.01); *H03K 19/0016* (2013.01); *H03K 21/00* (2013.01)
USPC ............ 711/130; 711/147; 711/151; 711/169

(58) Field of Classification Search
USPC ........................................................ 711/130
See application file for complete search history.

(56) References Cited

U.S. PATENT DOCUMENTS

| | | | | |
|---|---|---|---|---|
| 5,692,152 | A | * | 11/1997 | Cohen et al. ................... 711/140 |
| 2004/0064653 | A1 | * | 4/2004 | Gharachorloo et al. ...... 711/145 |

(Continued)

OTHER PUBLICATIONS

"TMS320C6678 Multicore Fixed and Floating-Point Digital Signal Processor", Data Manual, SPRS691, Texas Instruments Incorporated, Nov. 2010, pp. 1-259.

*Primary Examiner* — April Y Blair
*Assistant Examiner* — Prasith Thammavong
(74) *Attorney, Agent, or Firm* — Robert D. Marshall, Jr.; Frederick J. Telecky, Jr.

(57) ABSTRACT

Parallel pipelines are used to access a shared memory. The shared memory is accessed via a first pipeline by a processor to access cached data from the shared memory. The shared memory is accessed via a second pipeline by a memory access unit to access the shared memory. A first set of tags is maintained for use by the first pipeline to control access to the cache memory, while a second set of tags is maintained for use by the second pipeline to access the shared memory. Arbitrating for access to the cache memory for a transaction request in the first pipeline and for a transaction request in the second pipeline is performed after each pipeline has checked its respective set of tags.

2 Claims, 7 Drawing Sheets

(56) References Cited

U.S. PATENT DOCUMENTS

| | | | |
|---|---|---|---|
| 2006/0064552 A9* | 3/2006 | Hardage | 711/146 |
| 2006/0184747 A1* | 8/2006 | Guthrie et al. | 711/146 |
| 2007/0016758 A1* | 1/2007 | Tremblay et al. | 712/220 |
| 2007/0174597 A1* | 7/2007 | Joy et al. | 712/228 |
| 2007/0268825 A1* | 11/2007 | Corwin et al. | 370/230 |

* cited by examiner

CACHE WITH MULTIPLE ACCESS PIPELINES

CLAIM OF PRIORITY UNDER 35 U.S.C. 119(e)

The present application claims priority to and incorporates by reference US Provisional Application No. 61/387,283, filed Sep. 28, 2010, entitled "Cache Controller Architecture."

FIELD OF THE INVENTION

This invention generally relates to management of memory access by multiple requesters, and in particular to access to a shared memory resource in a system on a chip with multiple cores.

BACKGROUND OF THE INVENTION

System on Chip (SoC) is a concept that strives to integrate more and more functionality into a given device. This integration can take the form of either hardware or solution software. Performance gains are traditionally achieved by increased clock rates and more advanced processor nodes. Many SoC designs pair a digital signal processor (DSP) with a reduced instruction set computing (RISC) processor to target specific applications. A more recent approach to increasing performance has been to create multi-core devices. In this scenario, management of competition for processing resources is typically resolved using a priority scheme.

BRIEF DESCRIPTION OF THE DRAWINGS

Particular embodiments in accordance with the invention will now be described, by way of example only, and with reference to the accompanying drawings.

Figure 1:
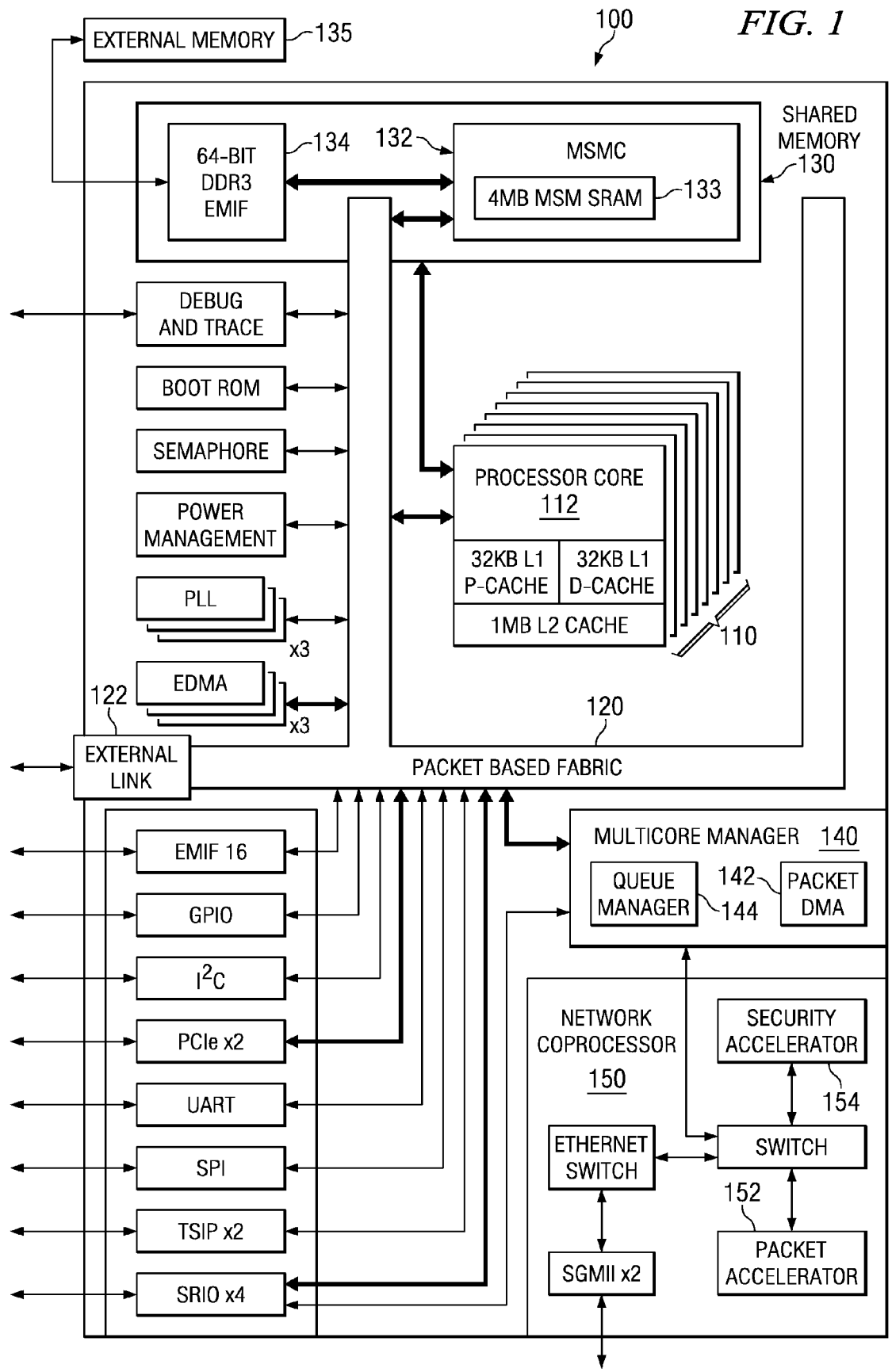
FIG. 1 is a functional block diagram of a system on chip (SoC) that includes an embodiment of the invention.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

High performance computing has taken on even greater importance with the advent of the Internet and cloud computing. To ensure the responsiveness of networks, online processing nodes and storage systems must have extremely robust processing capabilities and exceedingly fast data-throughput rates. Robotics, medical imaging systems, visual inspection systems, electronic test equipment, and high-performance wireless and communication systems, for example, must be able to process an extremely large volume of data with a high degree of precision. A multi-core architecture that embodies an aspect of the present invention will be described herein. In a typically embodiment, a multi-core system is implemented as a single system on chip (SoC). As used herein, the term "core" refers to a processing module that may contain an instruction processor, such as a digital signal processor (DSP) or other type of microprocessor, along with one or more levels of cache that are tightly coupled to the processor.

A multi-level cache controller within a core module may process different types of transfer requests from multiple requestors that may be targeted to different resources. In a multi-core scenario, these transfers may be divided into two categories: 1) local core central processing unit (CPU) generated, and 2) external master generated. In an embodiment that will be described in more detail below, external master generated transactions that target a local static random access memory (SRAM) within a core module are generated by a direct memory access (DMA) module. CPU transactions and DMA transactions may both be targeted for a same resource, such as SRAM that may also configured as a level 2 (L2) cache. Since both transaction go to the same endpoint, it would be logical to sequence the accesses together in a pipeline that provides access to the L2 cache/SRAM memory.

However, it has now been determined that when CPU transactions stop proceeding in the pipeline and stall the entire cache controller pipeline due to a cache miss, for example, a DMA transaction in the pipeline will also stall behind them. These DMA transactions may be generated by an external master that does not have visibility into the traffic generated by the local CPU and may be adversely affected by such stalls. In many cases, these DMA transactions are time sensitive, and are required to complete in a fixed amount of time. When they are stalled behind CPU transactions and do not complete, data corruption and data drops may result. Furthermore, it has now been determined that in some cases the CPU transactions may be directly or indirectly dependent on the DMA transactions, and in those cases, such stalls can cause deadlocks with each requestor waiting on the transactions initiated by the other requestor to complete.

In order to improve access and to avoid deadlock situations, embodiments of the present invention may provide separate pipelines in the cache controller for CPU and DMA transactions. These parallel pipelines interact only at the point where they require access to the same memory resource.

As will be explained in more detail below, CPU transaction requests that target an external address are routed so as not to interact with the DMA transactions, and therefore will not effect DMA performance. The cache controller may be configured so that all CPU transactions that target the cache but that miss go out of the cache controller on a separate interface. This interface is also kept separate from the DMA transaction request interface.

In the case where both CPU and DMA transactions interact and require access to a shared memory, an arbitration scheme is provided that tries to maintain a fair bandwidth distribution. For the return data and other acknowledgments back to the requestor, separate return paths are provided. Thus, each requestor essentially has a separate interface to the shared target resource.

In some embodiments, a provision is made to allow an application program that is being executed within the SoC to dynamically control bandwidth allocation to the shared resource. This may be done to optimize different tasks at different times, for example.

Other resources, such as buffers, configuration registers or register files which hold parameters that are required for processing these transactions are either duplicated or made concurrently readable from multiple sources. Examples of duplicated or concurrently accessible resources include, but are not limited to, the following: a memory protection attributes table, snoop tag status bits register file. This avoids any contention between CPU and DMA.

Thus, in embodiments of the present invention, CPU and DMA transactions are truly pipelined. If they do need the same resource, there is no performance impact since both accesses are pipelined in parallel. This avoids a CPU stall from stalling an external master that initiated a DMA transaction. A parallel pipeline prevents system dead-locks, unusually long DMA stalls and performance degradations in DMA.

FIG. 1 is a functional block diagram of a system on chip (SoC) 100 that includes an embodiment of the invention. System 100 is a multi-core SoC that includes a set of processor modules 110 that each include a processor core, level one (L1) data and instruction caches, and a level two (L2) cache. In this embodiment, there are eight processor modules 110; however other embodiments may have fewer or greater number of processor modules. In this embodiment, each processor core is a digital signal processor (DSP); however, in other embodiments other types of processor cores may be used. A packet-based fabric 120 provides high-speed non-blocking channels that deliver as much as 2 terabits per second of on-chip throughput. Fabric 120 interconnects with memory subsystem 130 to provide an extensive two-layer memory structure in which data flows freely and effectively between processor modules 110, as will be described in more detail below. An example of SoC 100 is embodied in an SoC from Texas Instruments, and is described in more detail in "TMS320C6678—Multi-core Fixed and Floating-Point Signal Processor Data Manual", SPRS691, November 2010, which is incorporated by reference herein.

External link 122 provides direct chip-to-chip connectivity for local devices, and is also integral to the internal processing architecture of SoC 100. External link 122 is a fast and efficient interface with low protocol overhead and high throughput, running at an aggregate speed of 50 Gbps (four lanes at 12.5 Gbps each). Working in conjunction with a routing manager 140, link 122 transparently dispatches tasks to other local devices where they are executed as if they were being processed on local resources.

There are three levels of memory in the SoC 100. Each processor module 110 has its own level-1 program (L1P) and level-1 data (L1D) memory. Additionally, each module 110 has a local level-2 unified memory (L2). Each of the local memories can be independently configured as memory-mapped SRAM (static random access memory), cache or a combination of the two.

In addition, SoC 100 includes shared memory 130, comprising internal memory 133 and optional external memory 135 connected through the multi-core shared memory controller (MSMC) 132. MSMC 132 allows processor modules 110 to dynamically share the internal and external memories for both program and data. The MSMC internal RAM offers flexibility to programmers by allowing portions to be configured as shared level-2 RAM (SL2) or shared level-3 RAM (SL3). SL2 RAM is cacheable only within the local L1P and L1D caches, while SL3 is additionally cacheable in the local L2 caches.

External memory may be connected through the same memory controller 132 as the internal shared memory via external memory interface 134, rather than to chip system interconnect as has traditionally been done on embedded processor architectures, providing a fast path for software execution. In this embodiment, external memory may be treated as SL3 memory and therefore cacheable in L1 and L2.

SoC 100 may also include several co-processing accelerators that offload processing tasks from the processor cores in processor modules 110, thereby enabling sustained high application processing rates. SoC 100 may also contain an Ethernet media access controller (EMAC) network coprocessor block 150 that may include a packet accelerator 152 and a security accelerator 154 that work in tandem. The packet accelerator speeds the data flow throughout the core by transferring data to peripheral interfaces such as the Ethernet ports or Serial RapidIO (SRIO) without the involvement of any module 110's DSP processor. The security accelerator provides security processing for a number of popular encryption modes and algorithms, including IPSec, SCTP, SRTP, 3GPP, SSL/TLS and several others.

Multi-core manager 140 provides single-core simplicity to multi-core device SoC 100. Multi-core manager 140 provides hardware-assisted functional acceleration that utilizes a packet-based hardware subsystem. With an extensive series of more than 8,000 queues managed by queue manager 144 and a packet-aware DMA controller 142, it optimizes the packet-based communications of the on-chip cores by practically eliminating all copy operations.

The low latencies and zero interrupts ensured by multi-core manager 140, as well as its transparent operations, enable new and more effective programming models such as task dispatchers. Moreover, software development cycles may be shortened significantly by several features included in multi-core manager 140, such as dynamic software partitioning. Multi-core manager 140 provides "fire and forget" software tasking that may allow repetitive tasks to be defined only once, and thereafter be accessed automatically without additional coding efforts.

Two types of buses exist in SoC 100 as part of packet based switch fabric 120: data buses and configuration buses. Some peripherals have both a data bus and a configuration bus interface, while others only have one type of interface. Furthermore, the bus interface width and speed varies from peripheral to peripheral. Configuration buses are mainly used to access the register space of a peripheral and the data buses are used mainly for data transfers. However, in some cases, the configuration bus is also used to transfer data. Similarly, the data bus can also be used to access the register space of a peripheral. For example, DDR3 memory controller 134 registers are accessed through their data bus interface.

Processor modules 110, the enhanced direct memory access (EDMA) traffic controllers, and the various system peripherals can be classified into two categories: masters and slaves. Masters are capable of initiating read and write transfers in the system and do not rely on the EDMA for their data transfers. Slaves on the other hand rely on the EDMA to perform transfers to and from them. Examples of masters include the EDMA traffic controllers, serial rapid I/O (SRIO), and Ethernet media access controller 150. Examples of slaves include the serial peripheral interface (SPI), universal asynchronous receiver/transmitter (UART), and inter-integrated circuit (I2C) interface.

Figure 2:
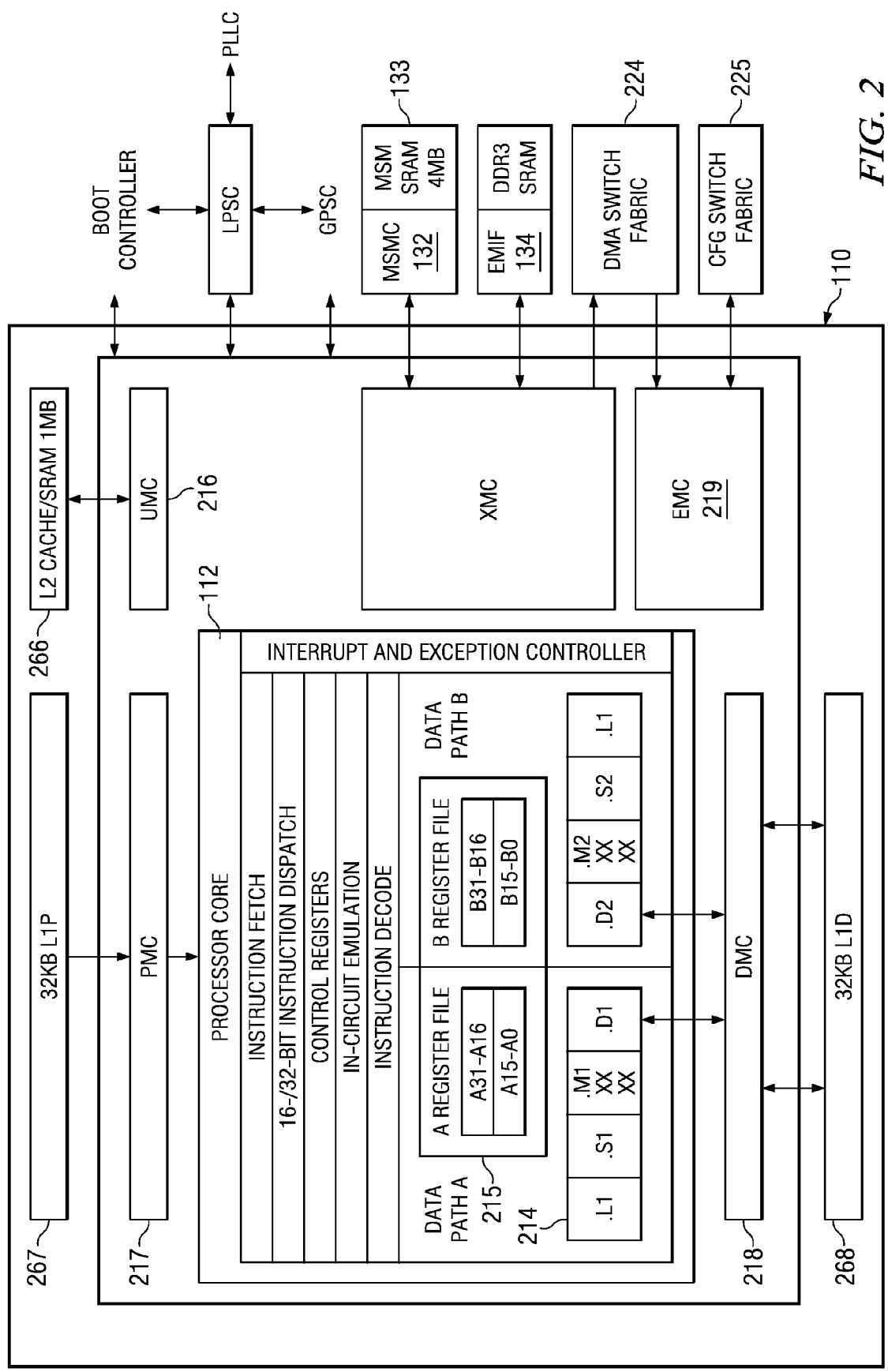
FIG. 2 is a more detailed block diagram of one processing module used in the SoC of FIG. 1.

FIG. 2 is a more detailed block diagram of one processing module 110 used in the SoC of FIG. 1. As mentioned above, SoC 100 contains two switch fabrics that form the packet based fabric 120 through which masters and slaves communicate. A data switch fabric 224, known as the data switched central resource (SCR), is a high-throughput interconnect mainly used to move data across the system. The data SCR is further divided into two smaller SCRs. One connects very high speed masters to slaves via 256-bit data buses running at a DSP/2 frequency. The other connects masters to slaves via 128-bit data buses running at a DSP/3 frequency. Peripherals that match the native bus width of the SCR it is coupled to can connect directly to the data SCR; other peripherals require a bridge.

A configuration switch fabric 225, also known as the configuration switch central resource (SCR), is mainly used to access peripheral registers. The configuration SCR connects the each processor module 110 and masters on the data switch fabric to slaves via 32-bit configuration buses running at a DSP/3 frequency. As with the data SCR, some peripherals require the use of a bridge to interface to the configuration SCR.

Bridges perform a variety of functions:
Conversion between configuration bus and data bus.
Width conversion between peripheral bus width and SCR bus width.
Frequency conversion between peripheral bus frequency and SCR bus frequency.

The priority level of all master peripheral traffic is defined at the boundary of switch fabric 120. User programmable priority registers are present to allow software configuration of the data traffic through the switch fabric. In this embodiment, a lower number means higher priority. For example: PRI=000b=urgent, PRI=111b=low.

All other masters provide their priority directly and do not need a default priority setting. Examples include the processor module 110, whose priorities are set through software in a unified memory controller (UMC) 216 control registers. All the Packet DMA based peripherals also have internal registers to define the priority level of their initiated transactions.

DSP processor core 112 includes eight functional units 214, two register files 215, and two data paths. The two general-purpose register files 215 (A and B) each contain 32 32-bit registers for a total of 64 registers. The general-purpose registers can be used for data or can be data address pointers. The data types supported include packed 8-bit data, packed 16-bit data, 32-bit data, 40-bit data, and 64-bit data. Multiplies also support 128-bit data. 40-bit-long or 64-bit-long values are stored in register pairs, with the 32 LSBs of data placed in an even register and the remaining 8 or 32 MSBs in the next upper register (which is always an odd-numbered register). 128-bit data values are stored in register quadruplets, with the 32 LSBs of data placed in a register that is a multiple of 4 and the remaining 96 MSBs in the next 3 upper registers.

The eight functional units 214 (.M1, .L1, .D1, .S1, .M2, .L2, .D2, and .S2) are each capable of executing one instruction every clock cycle. The .M functional units perform all multiply operations. The .S and .L units perform a general set of arithmetic, logical, and branch functions. The .D units primarily load data from memory to the register file and store results from the register file into memory. Each .M unit can perform one of the following fixed-point operations each clock cycle: four 32×32 bit multiplies, sixteen 16×16 bit multiplies, four 16×32 bit multiplies, four 8×8 bit multiplies, four 8×8 bit multiplies with add operations, and four 16×16 multiplies with add/subtract capabilities. There is also support for Galois field multiplication for 8-bit and 32-bit data. Many communications algorithms such as FFTs and modems require complex multiplication. Each .M unit can perform one 16×16 bit complex multiply with or without rounding capabilities, two 16×16 bit complex multiplies with rounding capability, and a 32×32 bit complex multiply with rounding capability. The .M unit can also perform two 16×16 bit and one 32×32 bit complex multiply instructions that multiply a complex number with a complex conjugate of another number with rounding capability.

Communication signal processing also requires an extensive use of matrix operations. Each .M unit is capable of multiplying a [1×2] complex vector by a [2×2] complex matrix per cycle with or without rounding capability. A version also exists allowing multiplication of the conjugate of a [1×2] vector with a [2×2] complex matrix. Each .M unit also includes IEEE floating-point multiplication operations, which includes one single-precision multiply each cycle and one double-precision multiply every 4 cycles. There is also a mixed-precision multiply that allows multiplication of a single-precision value by a double-precision value and an operation allowing multiplication of two single-precision numbers resulting in a double-precision number. Each .M unit can also perform one the following floating-point operations each clock cycle: one, two, or four single-precision multiplies or a complex single-precision multiply.

The .L and .S units support up to 64-bit operands. This allows for arithmetic, logical, and data packing instructions to allow parallel operations per cycle.

An MFENCE instruction is provided that will create a processor stall until the completion of all the processor-triggered memory transactions, including:
Cache line fills
Writes from L1D to L2 or from the processor module to MSMC and/or other system endpoints
Victim write backs
Block or global coherence operation
Cache mode changes
Outstanding XMC prefetch requests.

The MFENCE instruction is useful as a simple mechanism for programs to wait for these requests to reach their endpoint. It also provides ordering guarantees for writes arriving at a single endpoint via multiple paths, multiprocessor algorithms that depend on ordering, and manual coherence operations.

Each processor module 110 in this embodiment contains a 1024KB level-2 memory (L2) 266, a 32KB level-1 program memory (L1P) 267, and a 32KB level-1 data memory (L1D) 268. The device also contains a 4096KB multi-core shared memory (MSM) 132. All memory in SoC 100 has a unique location in the memory map.

Figure 3:
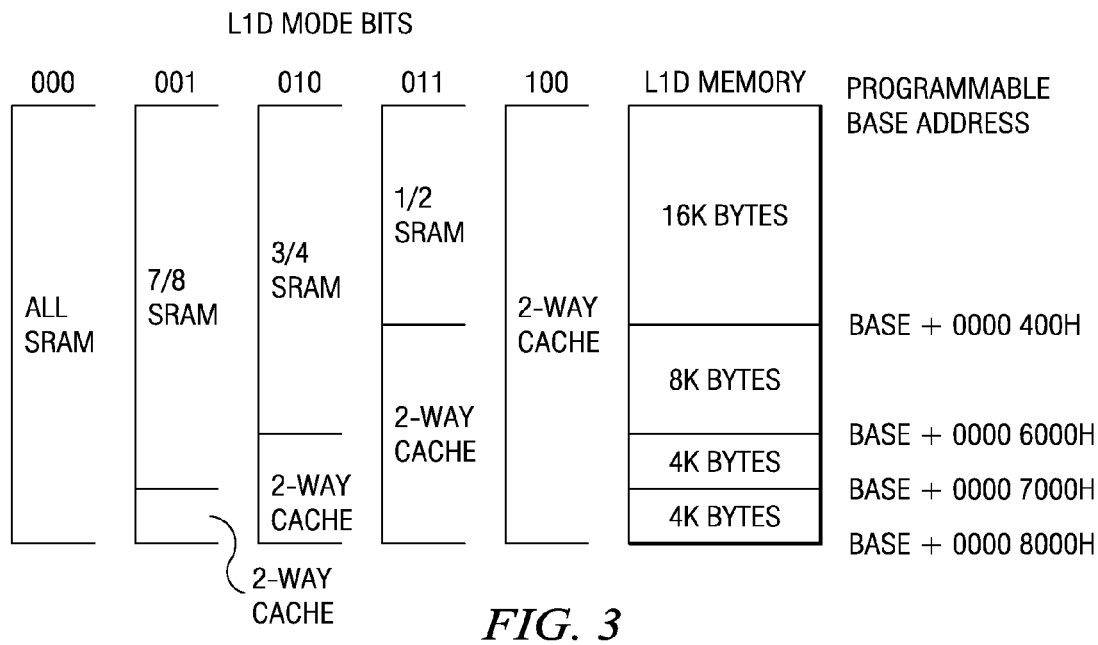
FIGS. 3 and 4 illustrate configuration of the L1 and L2 caches.

The L1P and L1D cache can be reconfigured via software through the L1PMODE field of the L1P Configuration Register (L1PCFG) and the L1DMODE field of the L1D Configuration Register (L1DCFG) of each processor module 110 to be all SRAM, all cache memory, or various combinations as illustrated in FIG. 3, which illustrates an L1D configuration; L1P configuration is similar. L1D is a two-way set-associative cache, while L1P is a direct-mapped cache.

Figure 4:
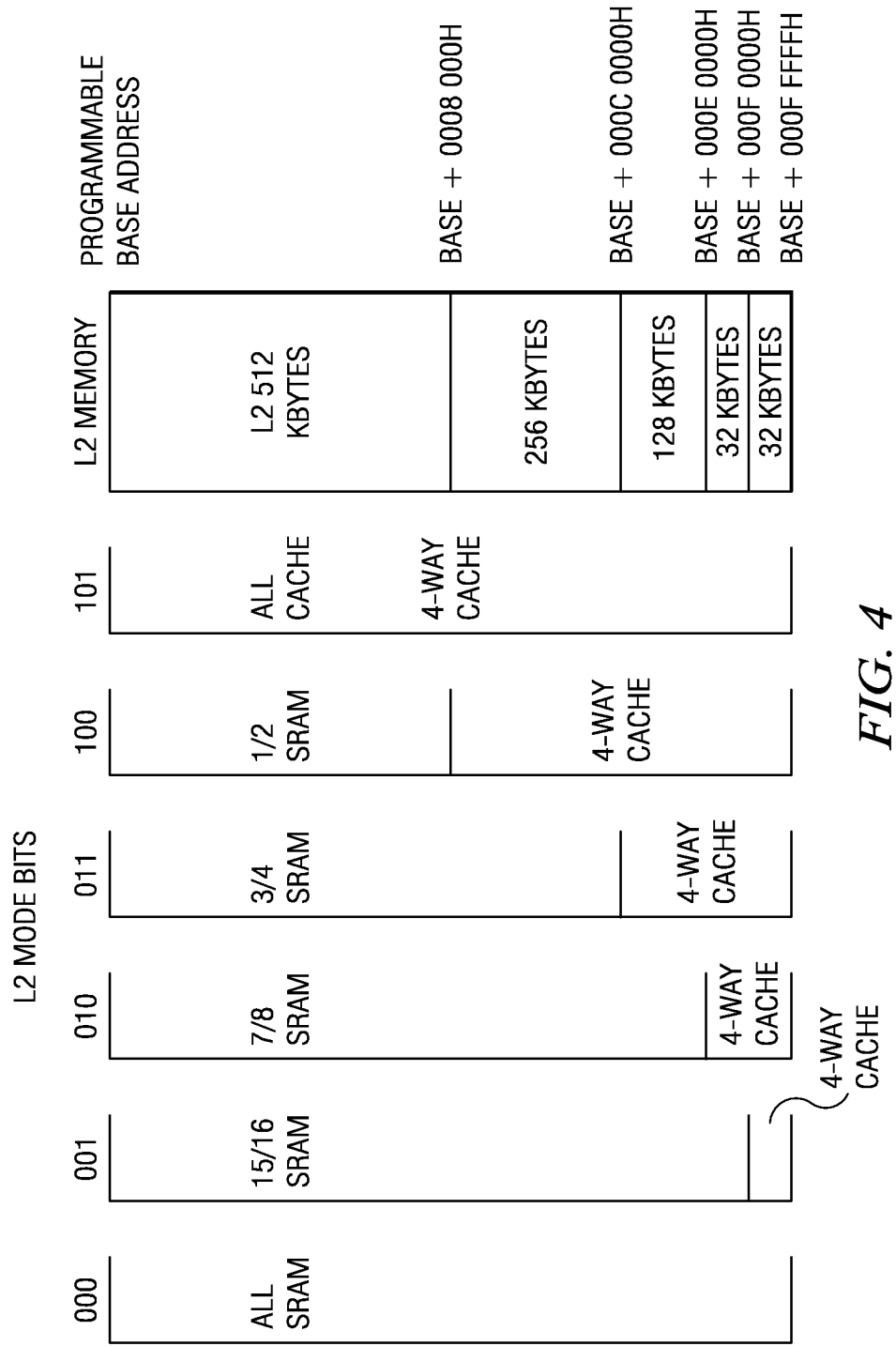

L2 memory 266 can be configured as all SRAM, all 4-way set-associative cache, or a mix of the two, as illustrated in FIG. 4. The amount of L2 memory that is configured as cache is controlled through the L2MODE field of the L2 Configuration Register (L2CFG) of each processor module 110.

Global addresses are accessible to all masters in the system. In addition, local memory can be accessed directly by the associated processor through aliased addresses, where the eight MSBs are masked to zero. The aliasing is handled within each processor module 110 and allows for common code to be run unmodified on multiple cores. For example, address location 0x10800000 is the global base address for processor module 0's L2 memory. DSP Core 0 can access this location by either using 0x10800000 or 0x00800000. Any other master in SoC 100 must use 0x10800000 only. Conversely, 0x00800000 can by used by any of the cores as their own L2 base addresses.

Level 1 program (L1P) memory controller (PMC) 217 controls program cache memory 267 and includes memory protection and bandwidth management. Level 1 data (L1D) memory controller (DMC) 218 controls data cache memory 268 and includes memory protection and bandwidth management. Level 2 (L2) memory controller, unified memory controller (UMC) 216 controls L2 cache memory 266 and includes memory protection and bandwidth management. External memory controller (EMC) 219 includes Internal DMA (IDMA) and a slave DMA (SDMA) interface that is coupled to data switch fabric 224. The EMC is coupled to configuration switch fabric 225. Extended memory controller (XMC) is coupled to MSMC 132 and to dual data rate 3 (DDR3) external memory controller 134.

Figure 5:
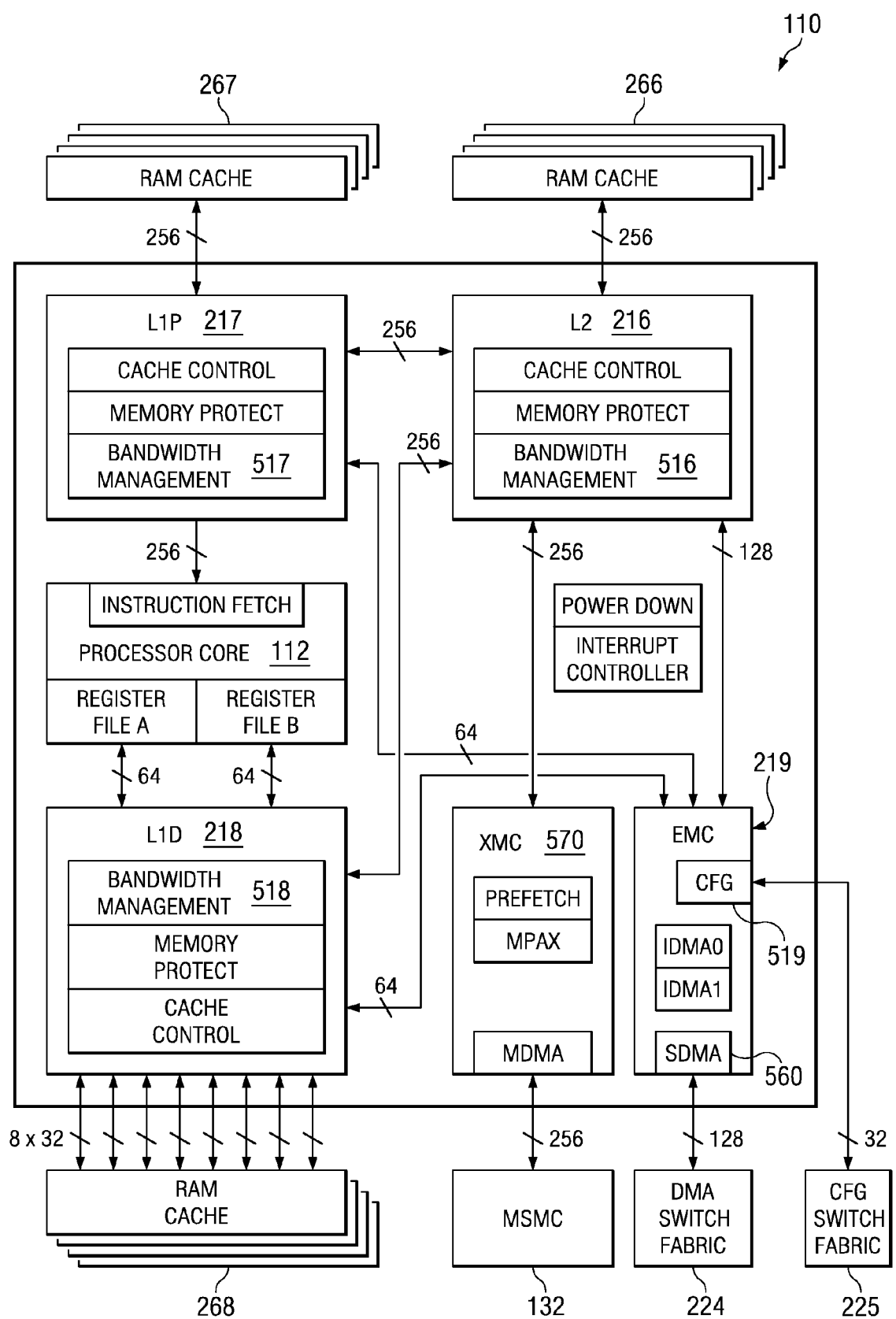
FIG. 5 is a more detailed block diagram of one processing module used in the SoC of FIG. 1.

FIG. 5 is a more detailed block diagram of one processing module 110 used in the SoC of FIG. 1 that illustrates distributed bandwidth management. When multiple requestors contend for a single processor module 110 resource, the conflict is resolved by granting access to the highest priority requestor. The following four resources are managed by the bandwidth management control hardware 516-519:

Level 1 Program (L1P) SRAM/Cache 267
Level 1 Data (L1D) SRAM/Cache 268
Level 2 (L2) SRAM/Cache 266
EMC 219

The priority level for operations initiated within the processor module 110 are declared through registers within each processor module 110. These operations are:

DSP-initiated transfers
User-programmed cache coherency operations
IDMA-initiated transfers The priority level for operations initiated outside the processor modules 110 by system peripherals is declared through the Priority Allocation Register (PRI_ALLOC). System peripherals that are not associated with a field in PRI_ALLOC may have their own registers to program their priorities.

Parallel Pipeline Access to Shared Resources

As mentioned earlier, in order to improve access to shared resources and to avoid deadlock situations, embodiments of the present invention may provide separate pipelines in each cache controller for CPU and DMA transactions. These parallel pipelines interact only at the point where they require access to the same memory resource. In the case where both CPU and DMA transactions interact and require access to a shared memory, an arbitration scheme is provided that tries to maintain a fair bandwidth distribution. For the return data and other acknowledgments back to the requestor, separate return paths are provided. Thus, each requestor essentially has a separate interface to the shared target resource.

Referring again to FIG. 5, slave DMA module 560 receives transaction requests from external masters via the data switch fabric 224. Referring back to FIG. 1, these requests may be originated by another processor module 110, by packet DMA 142 or from a master that is external to the SoC via external link 122, for example. As explained above, L1P memory 267, L1D memory 268 and L2 memory 266 may each be configured as a cache, a shared memory or a combination. The address space of each memory is also mapped into the SoC global address space, therefore, transaction requests from masters external to processor module 110 may access any of these memory resources within processor module 110.

CPU transaction requests that target an external address are routed so as not to interact with the DMA transactions, and therefore will not effect DMA performance. The cache controllers are configured so that all CPU transactions that target the cache but that miss go out of the cache controller on a separate interface. This interface is also kept separate from the DMA transaction request interface.

Figure 6:
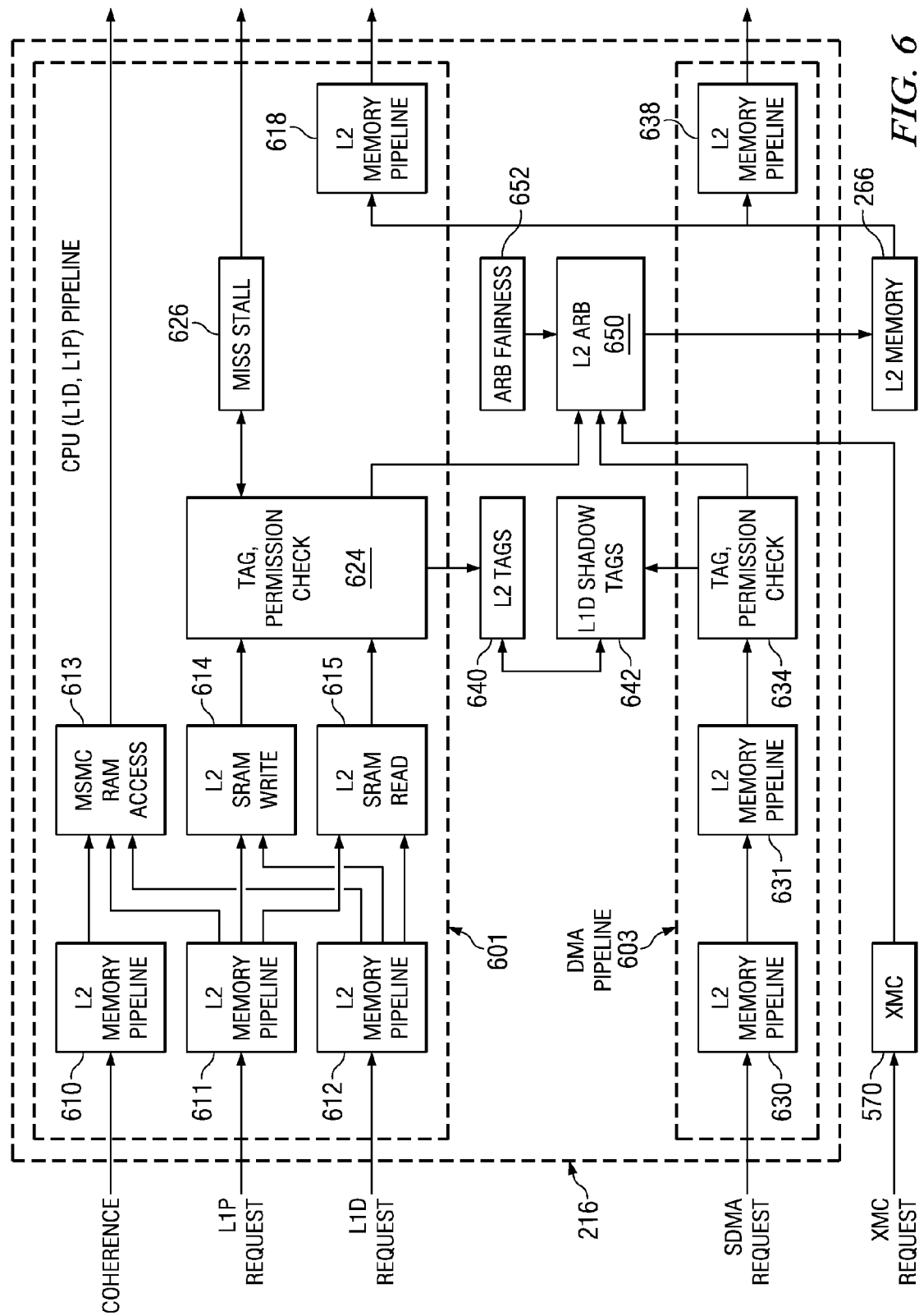
FIG. 6 is a block diagram illustrating parallel access pipelines used to access a shared resource.

FIG. 6 is a block diagram illustrating parallel access pipelines used to access a shared resource. In FIG. 6, the shared resource is L2 cache/SRAM 266 that is being accessed via L2 controller 216. However, L1P cache controller 217 and L1D cache controller 218 may be configured in a similar manner. In this example, there are two transaction request pipelines 601, 603 that operate in parallel to access shared resource 266.

L2 transaction request pipeline 601 receives transaction requests from L1P cache controller 217, L1D cache controller 218, and cache coherence requests from other cache controllers in the system. L2 transaction request pipeline 603 receives transaction requests from slave DMA module 560 when an external master is requesting access to shared resource 266 via DMA switch fabric 224.

Each pipeline 601, 603 includes a number of stages that receives each transaction request, checks a tag memory that indicates if a requested data is within the L2 cache memory or indicates if the requester has permission to access it, and provides buffering stages to match the clock rate of processor module 110. For example, a transaction request is received in pipeline stage 611 from L1P cache controller 217 when a miss occurs in the L1P cache. A transaction request is received in pipeline 612 from L1D cache controller 218 when a miss occurs in the L1D cache. A transaction request is received in pipeline stage 610 from other cache controllers that may be performing a coherency check. For example, L1D cache 268 or L1P cache 267 may be reset or flushed, or an external snooping operation may be underway to maintain coherency between L2 cache 266 and the level three memory controlled by MSMC 132. A transaction request is received in pipeline stage 630 from SDMA interface 560 in response to requests from another processor module within SoC 100.

After pipeline stage 611 receives a transaction access request from L1P cache controller 217, the request is routed to write stage 614 or to read stage 615. Similarly, after pipeline stage 612 receives a transaction access request from L1D cache controller 218, the request is routed to write stage 614 or to read stage 615. Permission check stage 624 then accesses L2 tags 640 to determine if the requested data item is currently within shared resource 266 and if the application being executed on the local processor has permission to access the data item. The general operation of caches and the use of tags to indicate access permission and to indicate if a particular data item is currently in cache memory is well known and need not be described in detail herein. L2 pipeline stage 624 may provide buffering while the tags are checked. If the data item is present, then the transaction request proceeds to L2 pipeline arbitration stage 650. However, if the requested data item is not present in L2 memory 266, then a transaction request is sent to stall stage 626 and sends a request to extended memory controller 570 for access to level 3 memory subsystem 130 (see FIG. 1). While a request to extended memory system 130 is in progress, pipeline 601 must stall and wait for a response from extended memory subsystem 130. When the results are returned from extended memory system 130, the requested data and status results of the access are provided to L2 pipeline stage 618 to return to L1P cache controller 217 or to L1D cache controller 218 and the pipeline stall is removed. Arbitration may then be repeated to update the shared resource 266 with the results returned from memory system 130.

When the requested data item is present in shared resource 266, pipeline stage 650 then arbitrates for access to shared resource 266. When the arbitration process grants access to shared memory 266, the requested data and status results of the access are provided to L2 pipeline stage 618 to return to L1P cache controller 217.

When CPU pipeline 601 receives a coherence request in pipeline stage 610, or a request from L1P in pipeline stage 611 or a request from L1D in pipeline stage 612 that is for an address in memory system 130, that request is moved to pipeline stage 613. A request is then sent directly to memory system 130 without involving tag check stage 624 or arbitration stage 650.

In pipeline 603, pipeline stage 630 receives a transaction access request from slave DMA module 560 when an external master is requesting access to shared resource 266 via DMA switch fabric 224. Pipeline stage 630 may also receive transaction requests from internal DMA modules IDMA1 and IDMA1 that are initiated internal to processor module 110. Pipeline stage 634 may access L1D tags 642 to determine if the requested data item is currently within L1D cache 668 in order to determine if L1D cache 268 and L2 SRAM 266 are coherent. Pipeline stage 634 may also access tags 640 to determine is the transaction request has permission to access a requested area in shared resource 266. L2 pipeline stage 631 may provide buffering while the tags are checked. If permission is granted, then the transaction request proceeds to L2 pipeline stage 650 to arbitrate for access to shared resource 266. When the arbitration process grants access to shared memory 266, the requested data and status results of the access are provided to L2 pipeline stage 638 to return to DMA module 560 and thereby to the external master that requested the transaction.

In this manner, a DMA transaction requests is not stalled behind a CPU transaction request from the L1P cache controller or from the L1D cache controller. These DMA transactions may be generated by an external master that does not have visibility into the traffic generated by the local CPU and in many cases, these DMA transactions are time sensitive and are required to complete in a fixed amount of time. By using parallel pipeline 603, DMA transactions will not stall behind CPU transactions that stall waiting on data from L3 memory. Therefore, data corruption and data drops in the external master are avoided. Furthermore, deadlocks that might otherwise occur in some cases in which a stalled CPU transaction may be directly or indirectly dependent on the DMA transactions, since parallel pipeline 603 bypasses stalled CPU requests to shared memory 266.

Tags 640 and 642 may be implemented as duplicate tag sets in order to eliminate access conflicts by pipeline 601 and 603. The number of stages in each pipeline 601, 603 is determined by the timing requirements of processor module 110. The general idea of pipeline processing with multiple stages is well known and does not need to be described in detail herein.

Arbitration logic 650 may be combined in a single logic block to control access to shared resource 266, or may be implemented as logic that is distributed within each pipeline. This allows these parallel pipelines to interact only at the point where they require access to the same memory resource.

This embodiment also includes arbitration fairness logic 652 that monitors the arbitration process to assure that each pipeline receives a fair portion of the access bandwidth of the shared resource. Fairness logic 652 may use a weighting scheme to allocate a portion of the bandwidth to each pipeline. One or more registers coupled to fairness logic 652 that are accessible to a program being executed within SoC 100 may be dynamically updated by the program to change the weighting values in order to optimized operation of the SoC. For example, in a real-time critical application, the fairness logic may be weighted to provide a high percentage of access bandwidth to the DMA pipeline. In a computational intensive application, the fairness logic may be weighted to provide a high percentage of access bandwidth to the CPU accesses. In a multi-core SoC, various processing modules 110 may have different fairness weighting for the shared resource access within each respective processor module.

Figure 7:
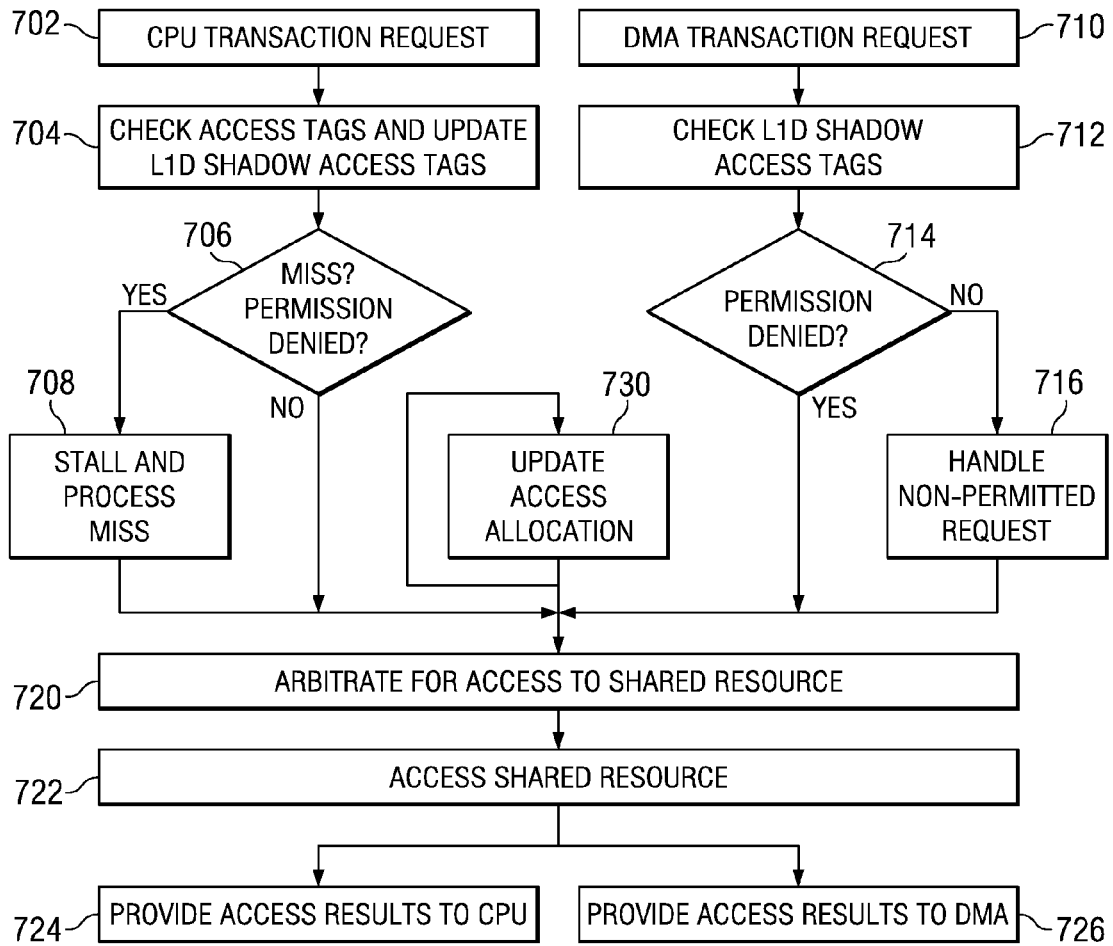
FIG. 7 is a flow diagram illustrating operation of parallel access pipelines to access a shared resource.

FIG. 7 is a flow diagram illustrating operation of parallel access pipelines to access a cache that has cache memory and tags. A request from a CPU is received 702 in a first pipeline for use by the processor to access cached data from a shared memory. A set of tags is maintained for use 704 by the first pipeline to control access to the cache memory. Depending on the transaction request and the availability of data in the shared resource, as indicated by the tags, the access may be stalled 706. This may be due to a cache miss, in which case an access will be made to a higher level memory subsystem to process 708 a miss request. Permission tags are also checked to determine if a task being executed on the processor is allowed to access the data item in the shared memory. In this case, the transaction may be modified 708 to cancel the request and then be allowed to return to the requester with an appropriate status indication.

A request from a DMA is received 710 in a second parallel pipeline for use by another memory access unit to access data from the shared memory. In this example, the memory access unit is a direct memory access (DMA) access unit; however other embodiments may use different types of requestors. A set of tags is maintained for use 712 by the second pipeline to control access to the shared memory. Depending on the transaction request and the availability of data in the shared resource, as indicated by the tags, the access may not be permitted 714. This may be due to the transaction request not having permission to access the shared resource. In this case, the transaction may be modified 716 to cancel the request and then be allowed to return to the requester with an appropriate status indication.

After checking the tags and handling any resulting stall conditions, each request is then arbitrated 720 for access to the shared resource. On each cycle, a winner of an arbitration contest is granted access 722 to the shared resource. The retrieved data and associated status is provided 724 to the CPU on one output interface, while retrieved data and associated status is provided 726 to the DMA on another output interface.

In some embodiments, the arbitration process uses a default, or a fixed allocation scheme, such as round robin scheme, or a priority based scheme. In this embodiment, a weighted scheme is used that may be dynamically updated 730 by an application program to change the weighting values in order to optimized operation of the SoC. For example, in a real-time critical application, the fairness logic may be weighted to provide a high percentage of access bandwidth to the DMA pipeline. In a computational intensive application, the fairness logic may be weighted to provide a high percentage of access bandwidth to the CPU accesses. In a multi-core SoC, various processing modules 110 may have different fairness weighting for the shared resource access within each respective processor module.

System Example

Figure 8:
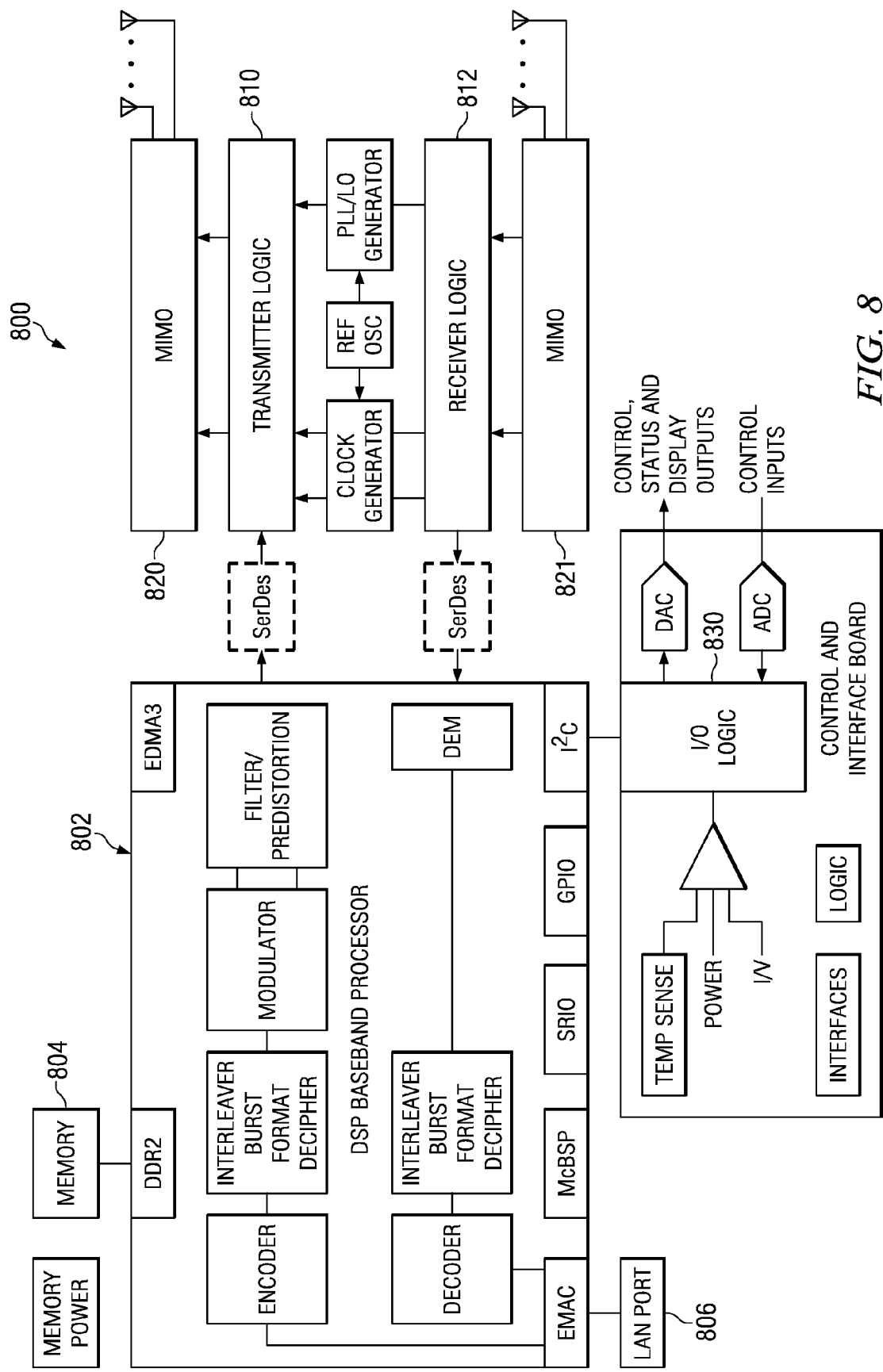
FIG. 8 is a block diagram of a system that includes the SoC of FIG. 1.

FIG. 8 is a block diagram of a base station for use in a radio network, such as a cell phone network. SoC 802 is similar to the SoC of FIG. 1 and is coupled to external memory 804 that may be used, in addition to the internal memory within SoC 802, to store application programs and data being processed by SoC 802. Transmitter logic 810 performs digital to analog conversion of digital data streams transferred by the external DMA (EDMA3) controller and then performs modulation of a carrier signal from a phase locked loop generator (PLL). The modulated carrier is then coupled to multiple output antenna array 820. Receiver logic 812 receives radio signals from multiple input antenna array 821, amplifies them in a low noise amplifier and then converts them to digital a stream of data that is transferred to SoC 802 under control of external DMA EDMA3. There may be multiple copies of transmitter logic 810 and receiver logic 812 to support multiple antennas.

The Ethernet media access controller (EMAC) module in SoC 802 is coupled to a local area network port 806 which supplies data for transmission and transports received data to other systems that may be coupled to the internet.

An application program executed on one or more of the processor modules within SoC 802 encodes data received from the internet, interleaves it, modulates it and then filters and pre-distorts it to match the characteristics of the transmitter logic 810. Another application program executed on one or more of the processor modules within SoC 802 demodulates the digitized radio signal received from receiver logic 812, deciphers burst formats, and decodes the resulting digital data stream and then directs the recovered digital data stream to the internet via the EMAC internet interface. The details of digital transmission and reception are well known. However, by making use of the parallel shared resource access pipelines within the processor modules of SoC 802, data drops are avoided while transferring the time critical transmission data to and from the transmitter and receiver logic.

Input/output logic 830 may be coupled to SoC 802 via the inter-integrated circuit (I2C) interface to provide control, status, and display outputs to a user interface and to receive control inputs from the user interface. The user interface may include a human readable media such as a display screen, indicator lights, etc. It may include input devices such as a keyboard, pointing device, etc.

Other Embodiments

Although the invention finds particular application to Digital Signal Processors (DSPs), implemented, for example, in a System on a Chip (SoC), it also finds application to other forms of processors. A SoC may contain one or more megacells or modules which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description. For example, in another embodiment, pipelines 601 and 602 may be merged by providing an initial arbitration for access to the merged CPU access pipeline by the L1P and L1D cache controllers. However, arbitration logic for access to the shared resource is still located after any stage that may result in a stall.

In another embodiment, there may be more than three shared resource access pipelines when there are additional internal or external transaction masters that have access to the shared resource.

In another embodiment, the shared resource may be just a memory that is not part of a cache. The shared resource may by any type of storage device or functional device that may be accessed by multiple masters in which access stalls by one master must not block access to the shared resource by another master.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A digital system comprising:
a shared resource including a cache subsystem having a shared memory, a first set of access tags and a duplicate second set of access tags;
a first access pipeline coupled to the shared resource, the first access pipeline being configured to receive a first transaction request from a first requester for access to the shared resource, wherein the first access pipeline includes a stall stage that is coupled to the first set of access tags and configured to stall when the first set of access tags indicate a miss in response to the first transaction request;
a second access pipeline coupled to the shared resource, the second access pipeline being configured to receive a second transaction request from a second requester for access to the shared resource, wherein the second access pipeline includes a check stage that is coupled to the second set of access tags, configured to check the second set of access tags and cancel the second transmission request if access is denied; and
arbitration logic configured to control access to the shared resource coupled to the first access pipeline and to the second access pipeline, wherein the arbitration logic is coupled to the first access pipeline after the stall stage and coupled to the second access pipeline after the check stage.

2. The system of claim 1, wherein:
the arbitration logic includes weighting logic configured to grant access to the shared resource in response to a weighting value stored in a program writable weighting register.

\* \* \* \* \*